(12) United States Patent
Matus et al.

(10) Patent No.: US 10,980,115 B1
(45) Date of Patent: Apr. 13, 2021

(54) FLEXIBLE HARNESS ASSEMBLY FOR SURFACE MOUNTED DEVICES

(71) Applicant: Littelfuse, Inc., Chicago, IL (US)

(72) Inventors: Yuriy B. Matus, Pleasanton, CA (US); Martin G. Pineda, Fremont, CA (US); Werner Johler, Chicago, IL (US); Brad A. Benson, Chicago, IL (US)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 16/893,735

(22) Filed: Jun. 5, 2020

(51) Int. Cl.
| | |
|---|---|
| *H05K 1/11* | (2006.01) |
| *H05K 1/18* | (2006.01) |
| *H05K 1/09* | (2006.01) |
| *H05K 1/02* | (2006.01) |
| *H05K 3/30* | (2006.01) |
| *H05K 3/22* | (2006.01) |

(52) U.S. Cl.
CPC .............. *H05K 1/115* (2013.01); *H05K 1/028* (2013.01); *H05K 1/0216* (2013.01); *H05K 1/09* (2013.01); *H05K 1/181* (2013.01); *H05K 1/189* (2013.01); *H05K 3/22* (2013.01); *H05K 3/303* (2013.01); *H05K 2201/09281* (2013.01); *H05K 2201/10053* (2013.01); *H05K 2201/10151* (2013.01)

(58) Field of Classification Search
CPC .......... H05K 1/115; H05K 1/181; H05K 1/09; H05K 3/303; H05K 3/22; H05K 2201/10151; H05K 2201/10053; H05K 2201/09281
USPC .................................................. 174/256, 257
See application file for complete search history.

(56) References Cited

U.S. PATENT DOCUMENTS

| | | | | |
|---|---|---|---|---|
| 5,090,116 A | * | 2/1992 | Henschen | B23K 3/0475 29/827 |
| 5,384,691 A | * | 1/1995 | Neugebauer | H01L 23/50 257/700 |
| 5,994,648 A | * | 11/1999 | Glovatsky | H05K 1/119 174/260 |
| 6,034,712 A | * | 3/2000 | Iwasaki | B41J 19/20 347/241 |
| 2006/0007172 A1 | * | 1/2006 | Baker | G01L 1/205 345/173 |
| 2007/0155247 A1 | * | 7/2007 | Takiar | H01L 25/0657 439/660 |

* cited by examiner

*Primary Examiner* — Sherman Ng

(74) *Attorney, Agent, or Firm* — Kacvinsky Daisak Bluni PLLC

(57) ABSTRACT

Embodiments of the disclosure are directed to a harness assembly including a substrate having a plurality of vias, and a trace formed atop the substrate, the trace extending between each of the plurality of vias. The harness assembly may further include a surface mounted device disposed within a via of the plurality of vias.

15 Claims, 5 Drawing Sheets

FLEXIBLE HARNESS ASSEMBLY FOR SURFACE MOUNTED DEVICES

FIELD OF THE DISCLOSURE

The disclosure relates generally to surface mounted devices (SMDs), and more particularly, to a flexible harness assembly for SMDs.

BACKGROUND OF THE DISCLOSURE

Surface mounted devices (SMDs) and sensors, such as negative/positive temperature coefficient sensors, reed switches, Anisotropic Magneto-Resistance (AMR) Giant Magneto-Resistance (GMR) sensors, Tunnel Magneto-Resistance (TMR) sensors, and/or fuses, or their combination, require connection to a control circuit. One conventional assembly approach includes placing sensors on a printed circuit board (PCB) and connecting the sensors by wires afterwards. In some cases, wire harnesses are also employed to carry out the connection. However, wire harnessing can be expensive. Therefore, how to wire one or more devices, such as SMDs or sensors, without the use of conventional wire harnesses, is a critical problem to be addressed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In view of the foregoing, what is needed is a universal flexible harness for SMDs and/or sensors connected by a trace line.

In one approach, a harness assembly may include a substrate having a plurality of vias, and a trace formed atop the substrate, the trace extending between each of the plurality of vias. The harness assembly may further include a surface mounted device disposed within a via of the plurality of vias.

In another approach, an assembly may include a substrate having a plurality of vias, and a trace formed atop the substrate, the trace extending between each of the plurality of vias. The assembly may further include a surface mounted device disposed within a via of the plurality of vias, the surface mounted device electrically connected with the trace.

In yet another approach, a method for forming a harness assembly may include providing a plurality of vias through a substrate, and forming a trace atop the substrate, the trace extending between each of the plurality of vias. The method may further include positioning a surface mounted device within a via of the plurality of vias.

BRIEF DESCRIPTION OF THE DRAWINGS

The accompanying drawings illustrate approaches of the disclosed embodiments so far devised for the practical application of the principles thereof, and in which.

Figure 1:
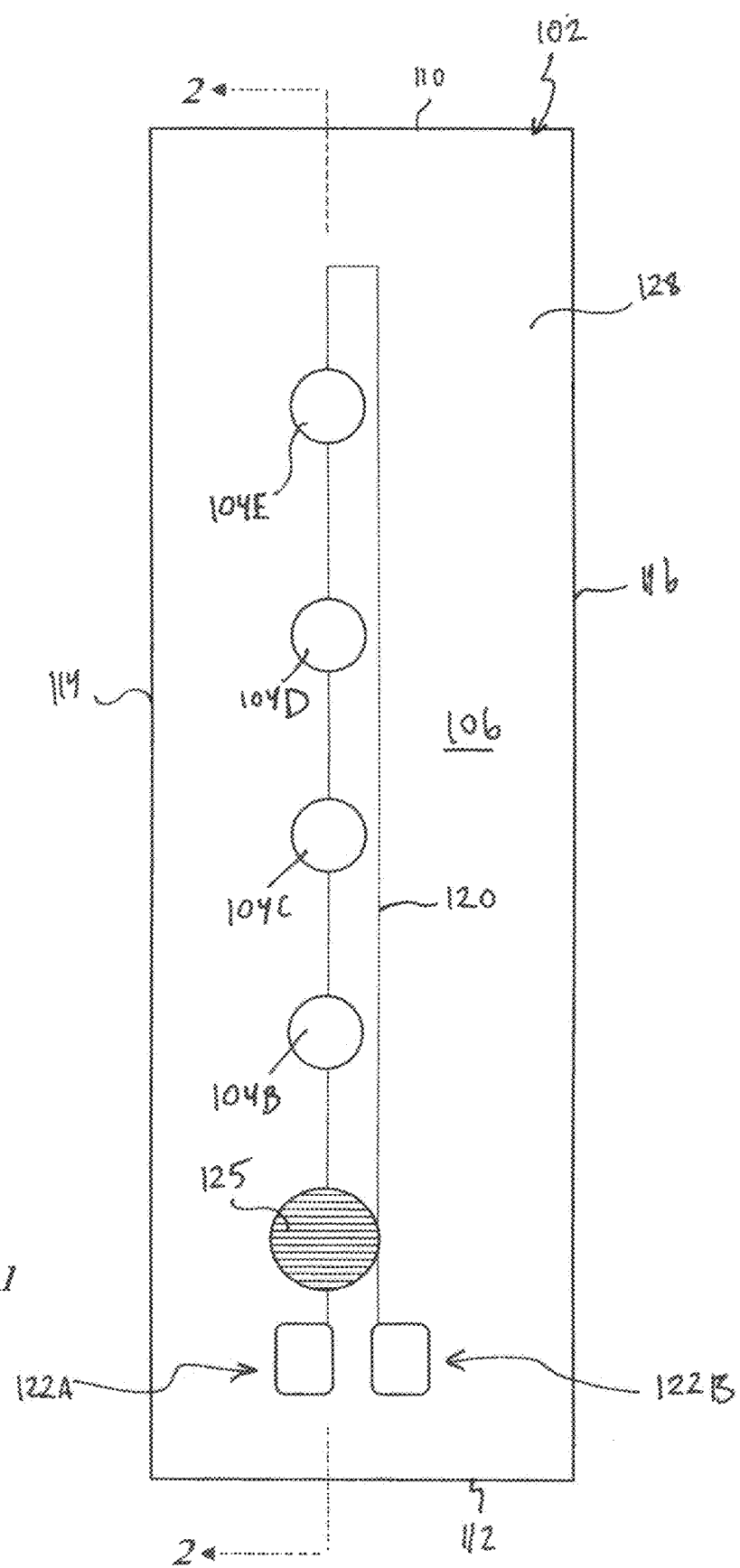
FIG. 1 is a top view of a harness assembly according to an approach of the disclosure.

The drawings are not necessarily to scale. The drawings are merely representations, not intended to portray specific parameters of the disclosure. The drawings are intended to depict typical embodiments of the disclosure, and therefore should not be considered as limiting in scope. In the drawings, like numbering represents like elements.

Furthermore, certain elements in some of the figures may be omitted, or illustrated not-to-scale, for illustrative clarity. Furthermore, for clarity, some reference numbers may be omitted in certain drawings.

DETAILED DESCRIPTION

Embodiments in accordance with the present disclosure will now be described more fully hereinafter with reference to the accompanying drawings. Assemblies and methods of the disclosure may be embodied in many different forms and should not be construed as being limited to the embodiments set forth herein. Rather, these embodiments are provided so that this disclosure will be thorough and complete, and will fully convey the scope of the system and method to those skilled in the art.

Embodiments herein provide an economical solution for low current carrying applications using a trace line connection to a flexible electronically conducting line deposited on a substrate. In some embodiments, the substrate, which may be flexible, has preset tabs or vias where SMD, such as sensors or fuses, can be attached. The advantage of this design is that long lead wires, sometimes required for the sensors, can be easily attached either manually or by automated line in a reflow furnace. The flatness and robustness of the design allows sensors to be placed in tight spots where cross-section of the device placement is limited. Moreover, in some embodiments, the leads may be overprinted with electromagnetic interference ink (EMI) or a polymer film to prevent signal interference from power sources. The design may be especially robust in places where vibration can otherwise affect the robustness of the joints, as flexible lines have a much lower young modulus than wire. Although non-limiting, some possible uses for this design include NTC leads to a controller, or a reed connection to feedback in appliances, car designs, or securities. Moreover, because the material for low thermal conductivity can have magnetic properties, the design can behave as a magnetic flux concentrator.

Figure 2:
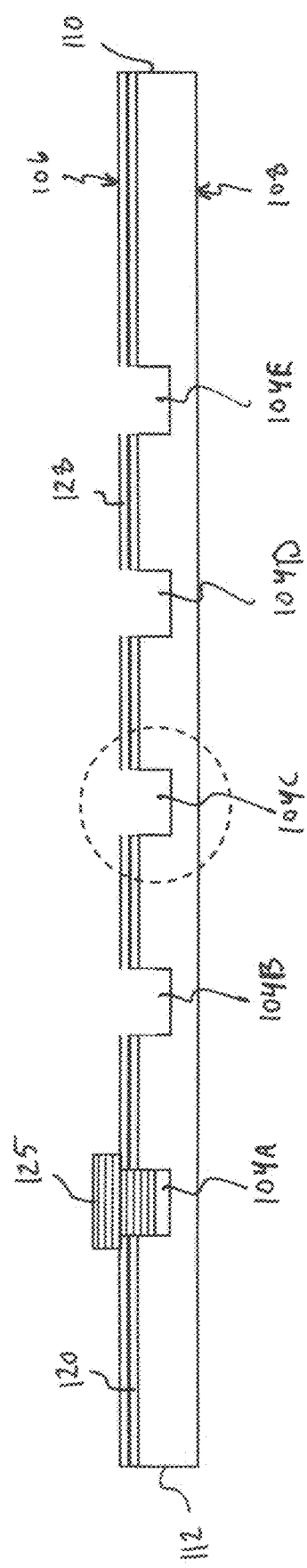
FIG. 2 is side cross-sectional view of the device of FIG. 1 along cutline 2-2 according to an approach of the disclosure.

Turning now to FIGS. 1-2, illustrated is an embodiment of a harness device or assembly 100 in accordance with the present disclosure. As shown, the assembly 100 may include a substrate 102 including a plurality of vias 104A-104E formed therein. The substrate may include a first main side 106 opposite a second main side 108, a first end 110 opposite a second end 112, and a first side 114 opposite a second side 116. In some embodiments, the substrate 102 may be a flexible printed circuit board (PCB), such as a flexible polymer substrate having stable dimensions under a given temperature that causes PTC change. For example, for ethylene vinyl acetate (EVA), it could be polyethylene terephthalate (PET) or polypropylene PTC with PFA (Perfluoroalkoxy) substrate, or PTC with polyvinylidene difluoride (PVDF) and a polyimide substrate.

The assembly 100 may further include a trace 120 formed along the substrate 102, e.g., atop the first main side 106. The trace 120 extends between two or more of the plurality of vias 104A-104E. Although non-limiting, the trace 120 may have multiple paths or legs that end at conductive tabs 122A-122B, as shown. In some embodiments, the trace 120 is a thin, conductive wire made from silver or copper, or a low thermal conductivity alloy, e.g., Alloy 52. In some embodiments, a barrier layer 128, such as an electromagnetic interference ink (EMI) or a polymer film, may be formed over the first main side 106 of the substrate 102, including atop the trace 120. The barrier layer 128 may prevent signal interference from various power sources (not shown) in proximity thereto.

The assembly 100 may further include one or more SMDs 125 disposed within the plurality of vias 104A-104E. In various embodiments, the SMDs 125 may be protection components and/or sensors including, but not limited to, fuses, PTCs, NTCs, ICs, Reed sensors, MOSFETS, resistors, and capacitors. Of these protection components, ICs and sensors are considered to be active protection components, while PTCs, NTCs, and fuses are considered to be passive components. It will be appreciated, however, that this arrangement is non-limiting, and the number and configuration of SMDs may vary depending on the application. The SMDs 125 may be connected by the trace 120.

Figure 3:
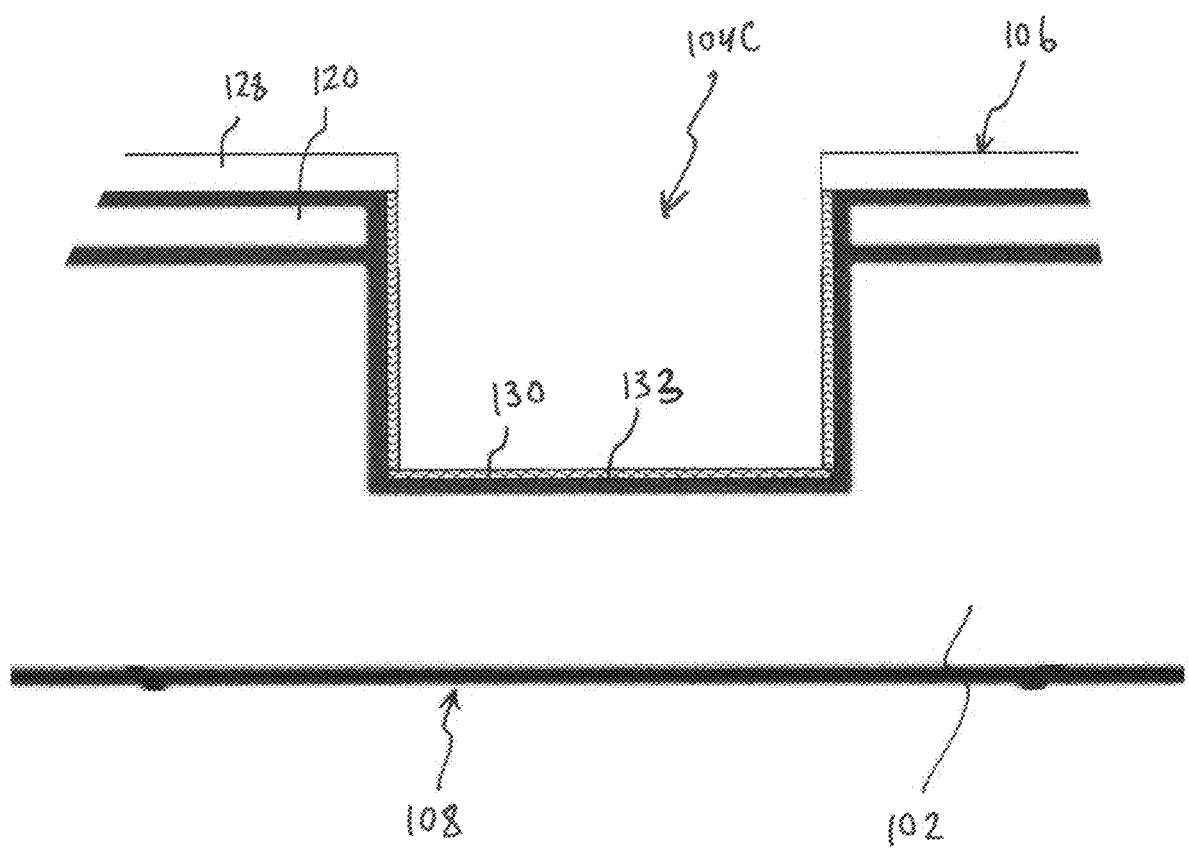
FIG. 3 is a side cross-sectional view of an opening in the device of FIG. 2 according to an approach of the disclosure.

Turning now to FIG. 3, via 104C according to embodiments of the present disclosure will be described in greater detail. As shown, the via 104C may be recessed into the first main side 106 of the substrate 102. In various embodiments, the via 104C may extend partially or entirely through the substrate 102. The via 104C may include an adhesive layer 130 deposited/formed along an inner surface 133 thereof. In some embodiments, the adhesive layer 130 may be a polymer adhesive operable to secure the SMDs within the via 104C. In other embodiments, the via 104C may be lined with a thermally conductive material, such as copper. It will be appreciated that the via 104C provides a conductive path between the trace 120 and the SMD.

Figure 4A:
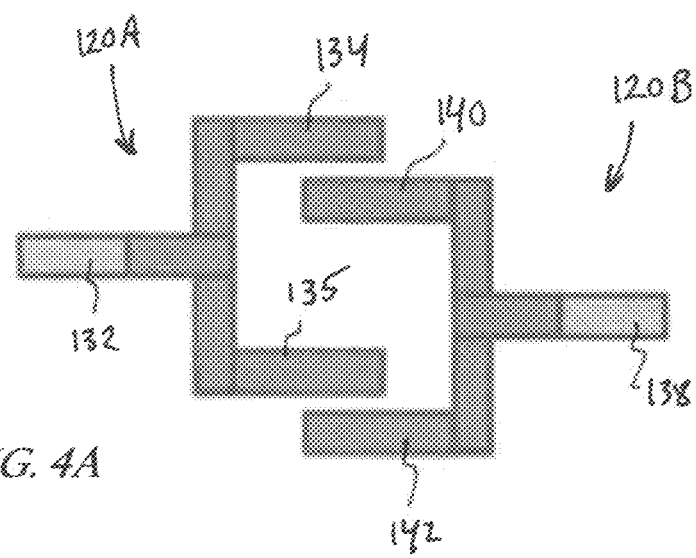
FIGS. 4A-4C depict various trace connections according to approaches of the disclosure.
Figure 4B:
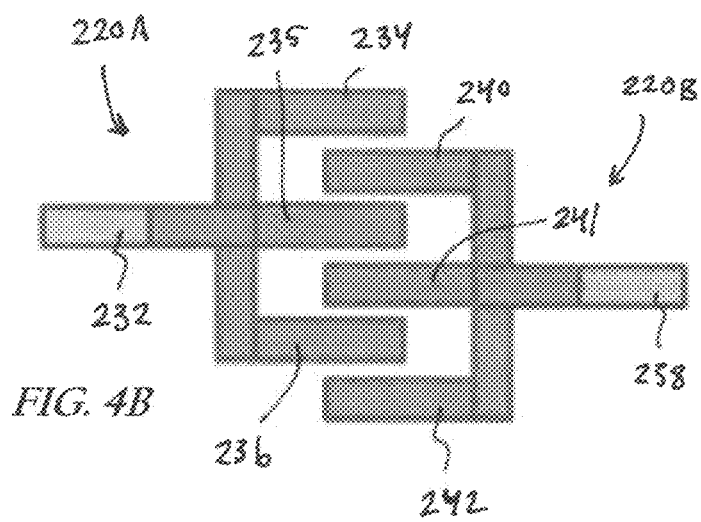
Figure 4C:
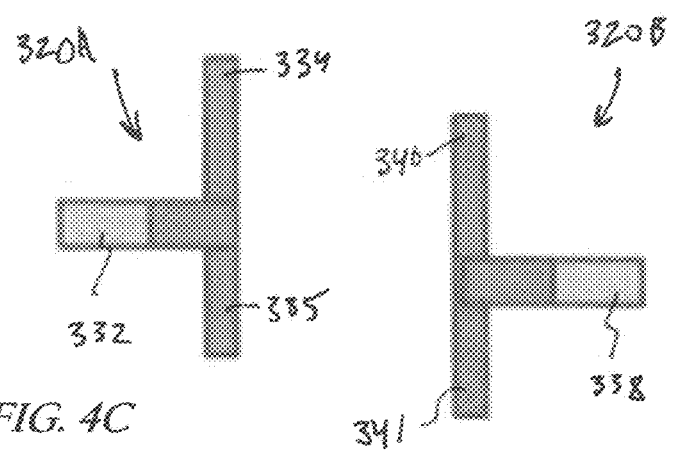

FIGS. 4A-4C demonstrate different trace arrangements according to various embodiments of the present disclosure. As shown in FIG. 4A, a first trace 120A includes a lead line 132 connected with a first set of fingers 134, 135. Similarly, a second trace 120B includes a lead line 138 connected with a second set of fingers 140, 142. The first set of fingers 134, 135 and the second set of fingers 140, 142 may be interleaved with respect to one another and connected by a conductive pad (not shown). In some embodiments, the lead lines 132, 138 may be a highly conductive material, such as silver or copper, while the first set of fingers 134, 135 and the second set of fingers 140, 142 may be a low expansion, low thermal conductivity material, such as Alloy 52.

As shown in FIG. 4B, a first trace 220A includes a lead line 232 connected with a first set of fingers 234, 235, 236. Similarly, a second trace 220B includes a lead line 238 connected with a second set of fingers 240, 241, 242. The first set of fingers 234-236 and the second set of fingers 240-242 may be interdigitated with respect to one another and connected by a conductive pad (not shown). Again, the lead lines 232, 238 may be a highly conductive material, such as silver or copper, while the first set of fingers 234-236 and the second set of fingers 240-242 may be a low expansion, low thermal conductivity material, such as Alloy 52.

As shown in FIG. 4C, a first trace 320A includes a lead line 332 connected with a first set of fingers 334, 335. In this embodiment, fingers 334, 335 extend perpendicular to the lead line 332. Similarly, a second trace 320B includes a lead line 338 connected with a second set of fingers 340 and 341, wherein the lead line 338 and the second set of fingers 340, 341 extend perpendicular to one another. As shown, the first set of fingers 334, 335 and the second set of fingers 340, 341 are not interwoven or interdigitated with respect to one another. Instead the first set of fingers 334, 335 and the second set of fingers 340, 341 generally extend parallel to one another.

Figure 5:
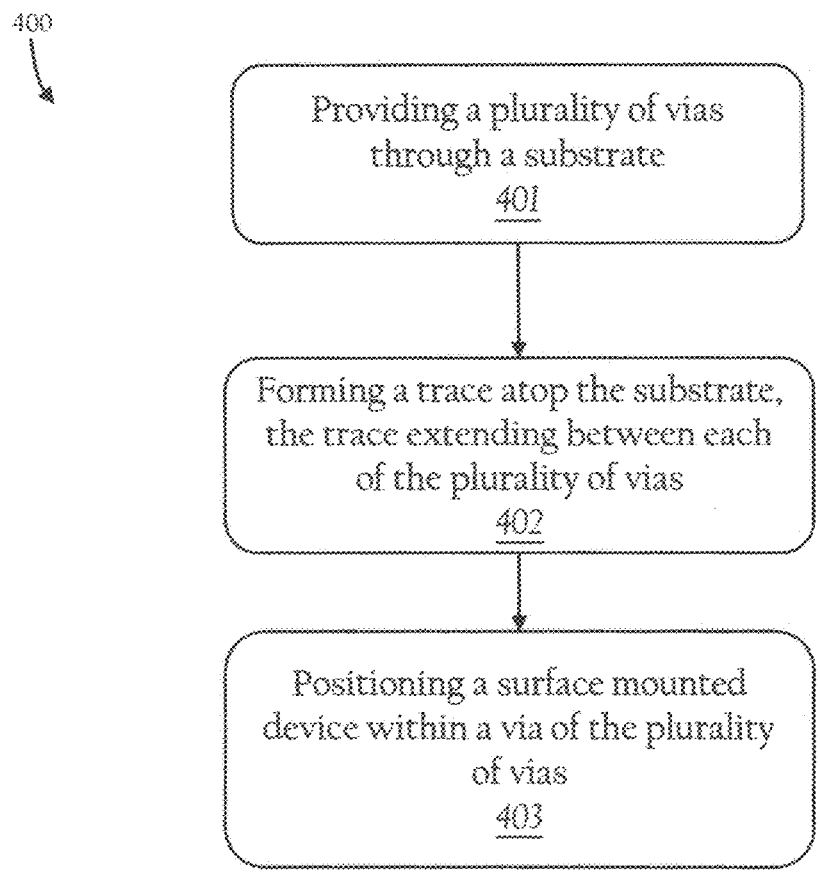
FIG. 5 depicts a method according to an approach of the disclosure.

Turning now to FIG. 5, a method 400 to form a harness assembly according to embodiments of the present disclosure will be described. At block 401, the method 400 may include providing a plurality of vias through a substrate. In some embodiments, the substrate may be a flexible PCB made from PET or PI.

At block 402, the method 400 may further include forming a trace atop the substrate, the trace extending between each of the plurality of vias. In some embodiments, the trace includes a lead line connected with a set of fingers. In some embodiments, the lead line is made from silver or copper, and the set of fingers is made from alloy 52. In some embodiments, a barrier layer may then be formed over the trace and the substrate, wherein the barrier layer is an electromagnetic interference ink or a polymer film.

At block 403, the method 400 may further include positioning a surface mounted device within a via of the plurality of vias. In some embodiments, a polymer adhesive layer is formed along an inner surface of one or more of the vias. In some embodiments, the surface mounted device(s) may include protection components and/or sensors including, but not limited to, fuses, PTCs, NTCs, ICs, Reed sensors, MOSFETS, resistors, and capacitors.

Although the illustrative method 400 is described above as a series of acts or events, the present disclosure is not limited by the illustrated ordering of such acts or events unless specifically stated. For example, some acts may occur in different orders and/or concurrently with other acts or events apart from those illustrated and/or described herein, in accordance with the disclosure. In addition, not all illustrated acts or events may be required to implement a methodology in accordance with the present disclosure. Furthermore, the method 400 may be implemented in association with the formation and/or processing of structures illustrated and described herein as well as in association with other structures not illustrated.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

In various embodiments, design tools can be provided and configured to create the datasets used to pattern the layers of the grating material and the diffracted optical elements described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A harness assembly, comprising: a substrate including a plurality of vias; a trace formed atop the substrate, the trace extending between each of the plurality of vias, the trace including a lead line connected with a set of fingers, wherein the lead line has a first conductivity and the set of fingers has a second conductivity, less than the first conductivity; and a surface mounted device disposed within a via of the plurality of vias.

2. The harness assembly of claim 1, wherein the lead line is made from silver or copper, and the set of fingers is made from alloy 52.

3. The harness assembly of claim 1, wherein the surface mounted device is a positive temperature coefficient material sensor, a negative temperature coefficient material sensor, a magnetoresistance sensor, or a reed switch.

4. The harness assembly of claim 1, further comprising a barrier layer formed over the trace.

5. The harness assembly of claim 4, wherein the barrier layer is an electromagnetic interference ink or a polymer film.

6. The harness assembly of claim 1, wherein the substrate is a printed circuit board.

7. The harness assembly of claim 1, further comprising an adhesive layer within the via.

8. An assembly, comprising: a substrate including a plurality of vias; a trace formed atop the substrate, the trace extending between each of the plurality of vias; and a surface mounted device disposed within a via of the plurality of vias, the surface mounted device electrically connected with the trace, the trace including a lead line connected with a set of fingers, wherein the lead line has a first conductivity and the set of fingers has a second conductivity, less than the first conductivity.

9. The assembly of claim 8, wherein the lead line is made from silver or copper, and the set of fingers is made from alloy 52.

10. The assembly of claim 8, wherein the surface mounted device is a positive temperature coefficient material sensor, a negative temperature coefficient material sensor, a magnetoresistance sensor, or a reed switch.

11. The assembly of claim 8, further comprising a barrier layer formed over the trace, wherein the barrier layer is an electromagnetic interference ink or a polymer film.

12. The assembly of claim 8, further comprising an adhesive layer along an inner surface of the via.

13. A method for forming a harness assembly, the method comprising: providing a plurality of vias through a substrate; forming a trace atop the substrate, the trace extending between each of the plurality of vias; coupling a lead line of the trace with a set of fingers, wherein the lead line has a first conductivity and the set of fingers has a second conductivity, less than the first conductivity; and positioning a surface mounted device within a via of the plurality of vias.

14. The method of claim 13, further comprising a barrier layer formed over the trace, wherein the barrier layer is an electromagnetic interference ink or a polymer film.

15. The method of claim 13, further comprising providing an adhesive layer along an inner surface of the via.

* * * * *